(12) United States Patent
Matsuo et al.

(10) Patent No.: US 11,417,626 B2
(45) Date of Patent: Aug. 16, 2022

(54) MANUFACTURING METHOD OF SEMICONDUCTOR DEVICE

(71) Applicant: Kioxia Corporation, Minato-ku (JP)

(72) Inventors: Mie Matsuo, Yokkaichi (JP); Hideshi Miyajima, Yokkaichi (JP)

(73) Assignee: Kioxia Corporation, Minato-ku (JP)

(*) Notice: Subject to any disclaimer, the term of this patent is extended or adjusted under 35 U.S.C. 154(b) by 45 days.

(21) Appl. No.: 17/006,958

(22) Filed: Aug. 31, 2020

(65) Prior Publication Data

US 2021/0074672 A1 Mar. 11, 2021

(30) Foreign Application Priority Data

Sep. 11, 2019 (JP) .............................. JP2019-165648

(51) Int. Cl.
| | |
|---|---|
| *H01L 25/065* | (2006.01) |
| *H01L 23/00* | (2006.01) |
| *H01L 25/18* | (2006.01) |
| *H01L 25/00* | (2006.01) |

(52) U.S. Cl.
CPC .............. *H01L 24/80* (2013.01); *H01L 24/08* (2013.01); *H01L 25/0657* (2013.01); *H01L 25/18* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ..... H01L 24/80; H01L 24/08; H01L 25/0657; H01L 25/18; H01L 25/50
See application file for complete search history.

(56) References Cited

U.S. PATENT DOCUMENTS

| | | | |
|---|---|---|---|
| 6,368,909 B2 | 4/2002 | Koo | |
| 7,153,735 B2 | 12/2006 | Sashida | |
| 9,558,945 B2 | 1/2017 | Fukuzumi et al. | |
| 9,646,873 B2 | 5/2017 | Konishi et al. | |
| 10,074,667 B1 | 9/2018 | Higashi et al. | |
| 10,211,166 B2 | 2/2019 | Matsuo et al. | |
| 2010/0197071 A1* | 8/2010 | Park ................... | H01L 27/1464 438/70 |
| 2011/0317050 A1* | 12/2011 | Shirono ............ | H01L 27/14683 348/294 |
| 2012/0049312 A1* | 3/2012 | Tanida .............. | H01L 27/14683 257/447 |
| 2017/0243910 A1* | 8/2017 | Ashidate .............. | H01L 21/187 |
| 2017/0301646 A1* | 10/2017 | Kim ...................... | H01L 24/08 |

(Continued)

FOREIGN PATENT DOCUMENTS

| | | | | |
|---|---|---|---|---|
| CN | 112530900 A | * | 3/2021 | ............ H01L 24/16 |
| JP | 6-188249 A | | 7/1994 | |

(Continued)

*Primary Examiner* — Nathan W Ha (74) *Attorney, Agent, or Firm* — Oblon, McClelland, Maier & Neustadt, L.L.P.

(57) ABSTRACT

In a manufacturing method of a semiconductor device according to an embodiment, a first substrate having a first elastic modulus is joined onto a second substrate having a second elastic modulus higher than the first elastic modulus. A first semiconductor element is formed on the first substrate. The first substrate is detached from the second substrate.

19 Claims, 9 Drawing Sheets

(56) References Cited

U.S. PATENT DOCUMENTS

| | | | | |
|---|---|---|---|---|
| 2018/0315814 | A1* | 11/2018 | Fan | H01L 29/36 |
| 2018/0323406 | A1* | 11/2018 | Li | H01L 51/5221 |
| 2018/0350785 | A1 | 12/2018 | Fong et al. | |
| 2019/0109042 | A1* | 4/2019 | Katkar | H01L 24/06 |
| 2019/0324341 | A1* | 10/2019 | Tonar | B32B 15/09 |
| 2020/0004082 | A1* | 1/2020 | Togashi | G02F 1/133308 |
| 2020/0051937 | A1* | 2/2020 | Uzoh | H01L 24/03 |
| 2020/0075534 | A1* | 3/2020 | Gao | H01L 24/08 |
| 2020/0135690 | A1* | 4/2020 | Lianto | H01L 24/29 |
| 2020/0161276 | A1* | 5/2020 | Kim | G09F 9/301 |
| 2020/0168652 | A1* | 5/2020 | Kato | H01L 27/1116 |
| 2020/0185307 | A1* | 6/2020 | Tsai | H01L 23/481 |
| 2020/0194396 | A1* | 6/2020 | Uzoh | H01L 25/0657 |
| 2021/0050326 | A1* | 2/2021 | Choi | H01L 24/16 |
| 2021/0066251 | A1* | 3/2021 | Kim | H01L 24/83 |
| 2021/0074672 | A1* | 3/2021 | Matsuo | H01L 25/50 |
| 2021/0074696 | A1* | 3/2021 | Clark | G03F 1/42 |
| 2021/0296282 | A1* | 9/2021 | Gao | H01L 24/80 |

FOREIGN PATENT DOCUMENTS

| | | |
|---|---|---|
| JP | 11-330390 A | 11/1999 |
| JP | 4252537 B2 | 4/2009 |
| JP | 2011-204829 A | 10/2011 |
| JP | 6203152 B2 | 9/2017 |
| JP | 2018-152419 A | 9/2018 |
| JP | 2018-163970 A | 10/2018 |
| JP | 2019-52057 A | 4/2019 |
| TW | 201413832 A | 4/2014 |

* cited by examiner

MANUFACTURING METHOD OF SEMICONDUCTOR DEVICE

CROSS REFERENCE TO RELATED APPLICATIONS

This application is based upon and claims the benefit of priority from the prior Japanese Patent Application No. 2019-165648, filed on Sep. 11, 2019, the entire contents of which are incorporated herein by reference.

FIELD

The embodiments relate to a manufacturing method of semiconductor device.

BACKGROUND

There have been developed three-dimensional memory cell arrays in which a plurality of memory cells are three-dimensionally arranged. The number of stacked layers in such memory cell arrays is increased to increase the data storage capacity. When the number of stacked layers in a memory cell array is increased, its substrate is likely to warp due to stress caused by the stacked layers. Warp of the substrate leads to problems such as transport errors, substrate breakage, reduction in yield ratio, and characteristic degradation of elements in the manufacturing process.

BRIEF DESCRIPTION OF THE DRAWINGS

FIGS. 1A to 2C are sectional views illustrating a manufacturing method of a semiconductor memory according to a first embodiment.

DETAILED DESCRIPTION

Embodiments will now be explained with reference to the accompanying drawings. The present invention is not limited to the embodiments. In the embodiments, "an upper direction" or "a lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

In a manufacturing method of a semiconductor device according to an embodiment, a first substrate having a first elastic modulus is joined onto a second substrate having a second elastic modulus higher than the first elastic modulus. A first semiconductor element is formed on the first substrate. The first substrate is detached from the second substrate.

First Embodiment

FIGS. 1A to 2C are sectional views illustrating a manufacturing method of a semiconductor memory according to a first embodiment. The present embodiment is related to a manufacturing method of a NAND flash memory including a three-dimensional memory cell array in which a plurality of memory cells are three-dimensionally arranged, and a CMOS (Complementary Metal-Oxide-Semiconductor) circuit that controls the memory cell array. The memory cell array and the CMOS circuit are stacked in a direction substantially perpendicular to a surface of a substrate 10. The present embodiment is not limited to a NAND flash memory, and can be applied to any semiconductor device that is formed by stacking semiconductor elements.

Figure 1A:
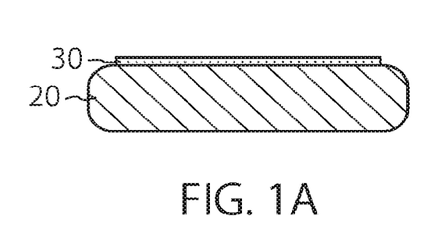
Figure 1B:
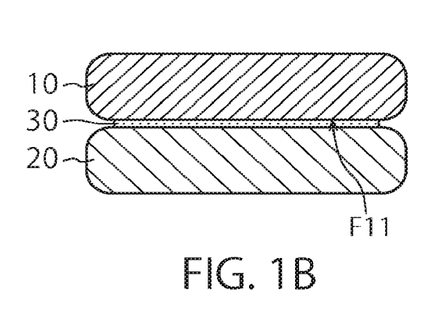

First, a separable layer (a first separable layer) 30 is formed on a surface of a substrate 20 as illustrated in FIG. 1A. Next, the substrate 10 is attached onto the separable layer 30 as illustrated in FIG. 1B. The substrate 10 is attached to the separable layer 30 with a first face F11 toward the substrate 20 and the separable layer 30. The substrate 10 is, for example, a semiconductor substrate including a silicon single crystal or the like. A material having a higher elastic modulus and being harder than the substrate 10 is used as the substrate 20. That is, assuming that the substrate 10 has a first elastic modulus, the substrate 20 has a second elastic modulus higher than the first elastic modulus. In the present specification, the elastic modulus indicates bending elasticity represented by the Young's modulus. For example, when the substrate 10 is a silicon single crystal, the substrate 20 can be a single crystal of SiC, AlN, SiN, or $Al_2O_3$ (sapphire), a polycrystal thereof, or a composite of these materials. The substrate 20 can be a laminate of these materials or a substrate coated with these materials.

When the substrate 10 is a silicon single crystal, the elastic modulus of the substrate 10 is approximately 190 GPa, for example. On the other hand, the elastic modulus of the substrate 20 is preferably approximately 200 GPa or more. For example, when the substrate 20 is an SiC, the elastic modulus of the substrate 20 is approximately 390 GPa. When the substrate 20 is an AlN, the elastic modulus of the substrate 20 is approximately 320 GPa. When the substrate 20 is an SiN, the elastic modulus of the substrate 20 is approximately 290 GPa. When the substrate 20 is an $Al_2O_3$ (sapphire), the elastic modulus of the substrate 20 is approximately 470 GPa.

The substrate 20 is thicker than the substrate 10. Accordingly, the substrate 20 can support or reinforce the substrate 10.

A material that enables the substrates 10 and 20 to be joined to each other, such as a porous silicon film or a silicon dioxide film, and that is lower in the density and is weaker (more fragile) than the substrates 10 and 20 is used as the separable layer 30. For example, when the separable layer 30 is a porous silicon film, the porosity of the separable layer 30 is preferably 20% to 80% to be able to adhere between the substrate 10 and the substrate 20 and to be able to easily separate the substrate 10 from the substrate 20. Accordingly, the separable layer 30 can separate the substrates 10 and 20 in a subsequent process and does not damage the substrates 10 and 20. The surface of the separable layer 30 is flattened by CMP (Chemical Mechanical Polishing) so as to enable junction between the substrates 10 and 20.

Figure 1C:
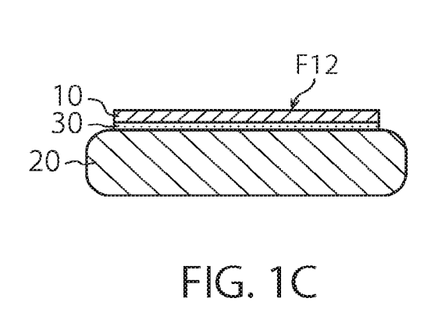

Next, a second face F12 of the substrate 10 on the opposite side to the first face F11 is polished by a polishing method (Back Side Grinding) or a CMP (Chemical Mechanical Polishing) method and the second face F12 of the substrate 10 is further etched by a wet etching method as illustrated in FIG. 1C. Accordingly, the substrate 10 is thinned.

Figure 2A:
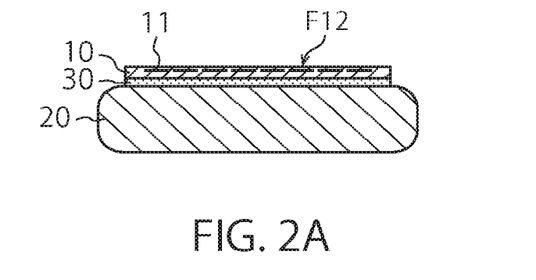

Subsequently, a memory cell array 11 being a first semiconductor element is formed on the second face F12 of the substrate 10 as illustrated in FIG. 2A. The memory cell array 11 can be a three-dimensional memory cell array in which a plurality of memory cells are three-dimensionally arranged.

A configuration of the memory cell array 11 is explained in detail below.

Figure 3:
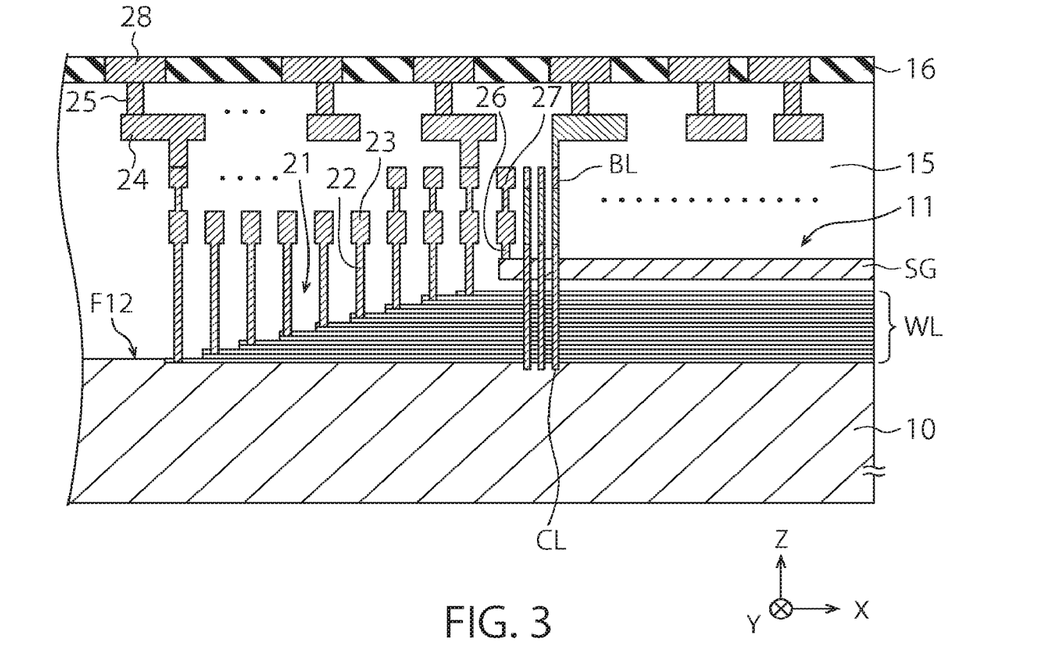
FIG. 3 is a sectional view illustrating a configuration of a part of the memory cell array and a peripheral part thereof.
Figure 4:
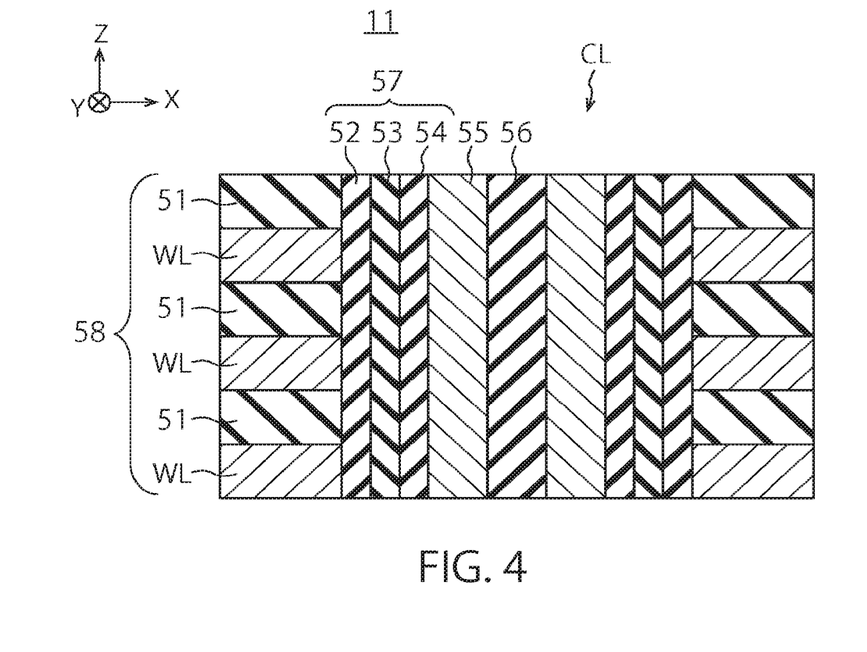
FIG. 4 is an enlarged sectional view of a columnar part of the memory cell array.

FIG. 3 is a sectional view illustrating a configuration of a part of the memory cell array 11 and a peripheral part thereof. FIG. 4 is an enlarged sectional view of a columnar part CL of the memory cell array 11. FIG. 3 illustrates a stepped structure part 21 of the memory cell array 11.

As illustrated in FIG. 3, the memory cell array 11 including the memory cells is formed on the substrate 10. The memory cell array 11 includes a plurality of conductive layers (WL in FIG. 4) and a plurality of insulating layers (51 in FIG. 4) alternately stacked in a Z direction (a direction perpendicular to the second face F12). As illustrated in FIG. 4, the conductive layers are provided as word lines WL. The insulating layers 51 are provided between word lines WL adjacent in the Z direction, and electrically insulate the word lines WL from each other. The word lines WL are electrically connected to a word wiring layer 23 via contact plugs 22, respectively. The word lines WL include, for example, a conductive material such as tungsten. The insulating layers 51 include, for example, an insulating material such as a silicon dioxide film.

A selection gate SG is provided on a stack body including the word lines WL and the insulating layers 51. The selection gate SG is electrically connected to a selection-gate wiring layer 27 via a contact plug 26. The selection gate SG also includes a conductive material such as tungsten. An interlayer dielectric film 15 is provided on the selection gate SG. A wiring layer 24, contact plugs 25, and metal pads 28 are formed in or on the interlayer dielectric film 15. An interlayer dielectric film 16 is provided between the metal pads 28 in the topmost layer.

The columnar parts CL penetrate through the word lines WL and the selection gate SG, and are electrically connected to bit lines BL. As illustrated in FIG. 4, the columnar parts CL each include a memory dielectric film 57, a channel semiconductor layer 55, and a core dielectric film 56 extending in the Z direction. The memory dielectric film 57 includes a block dielectric film 52, a charge accumulation layer 53, and a tunnel dielectric film 54. The charge accumulation layer 53 includes, for example, an insulating material such as a silicon nitride film and is formed on a side surface of a stack body 58 with the block dielectric film 52 interposed therebetween. The channel semiconductor layer 55 includes, for example, polysilicon and is formed on a side surface of the charge accumulation layer 53 with the tunnel dielectric film 54 interposed therebetween. The block dielectric film 52, the tunnel dielectric film 54, and the core dielectric film 56 include, for example, an insulating material such as a silicon dioxide film or a metal insulating film. The charge accumulation layer 53 can be any other layer than an insulating film as long as it can accumulate charges therein.

With the selection gate SG in a penetrated state, the columnar parts CL are selectively connected to the bit lines BL and receive a voltage from the connected bit lines BL. In a selected columnar part CL, charges are injected or emitted between the channel semiconductor layer 55 and the charge accumulation layer 53 via the tunnel dielectric film 54. This enables data to be written or erased. The block dielectric film 52 is provided to block leakage of charges accumulated in the charge accumulation layer 53 to the word lines WL. Configurations at intersections between the word lines WL and the memory dielectric film 57 are the memory cells. The memory cell array 11 having the configuration and function described above is formed on the substrate 10.

In this way, the substrate 10 is thinned on the substrate 20 and the memory cell array 11 is formed on the substrate 10 while the substrate 20 is used as a support substrate. Accordingly, even when a stack body in which many layers of plural types of materials are stacked as the memory cell array 11 is formed on the thinned substrate 10, the substrate 10 warps little because being supported by the substrate 20, and keeps a substantially flat state with support by the surface of the substrate 20.

Figure 2B:
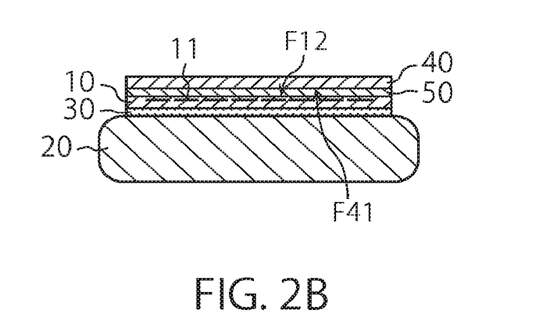

Referring back to FIG. 2, a substrate 40 as a third substrate having a CMOS circuit 50 as a second semiconductor element is subsequently joined (bonded) onto the second face F12 of the substrate 10 as illustrated in FIG. 2B. The substrate 40 is already thinned and the CMOS circuit 50 is formed on a third face F41 of the substrate 40. At this time, the substrate 40 is joined to the substrate 10 with the CMOS circuit 50 toward the second face F12 so as to enable the CMOS circuit 50 to be connected to the memory cell array 11. The CMOS circuit 50 is, for example, a CMOS circuit (a logic circuit) constituting a controller for the memory cell array 11.

Figure 5:
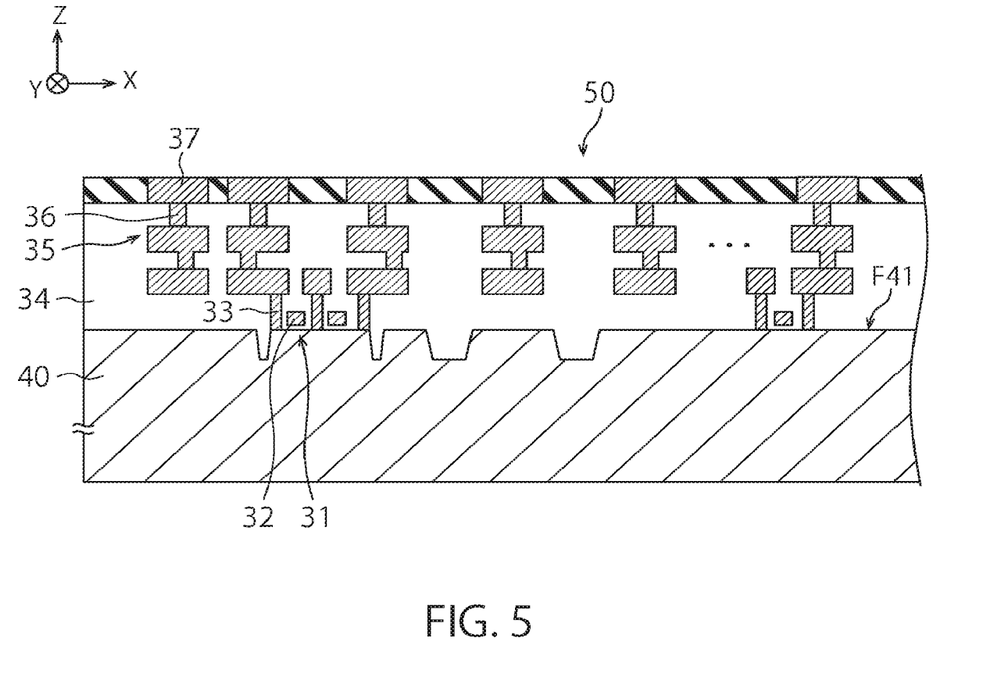
FIG. 5 is a sectional view illustrating a configuration of a part of the CMOS circuit and a peripheral part thereof.

FIG. 5 is a sectional view illustrating a configuration of a part of the CMOS circuit 50 and a peripheral part thereof. A plurality of transistors 31 are provided on the third face F41 of the substrate 40. Each of the transistors 31 includes a gate electrode 32 provided on the third face F41 of the substrate 40 with a gate dielectric film interposed therebetween, and a source diffusion layer and a drain diffusion layer (both not illustrated) provided in the substrate 40. The transistors 31 constitute the CMOS circuit 50 and function to control the memory cell array 11.

Further, a plurality of plugs 33 are provided on the source diffusion layer or the drain diffusion layer of the transistor 31 and multilayer wiring structures 35 are provided on the plugs 33. Furthermore, contact plugs 36 are provided on the multilayer wiring structures 35 and metal pads 37 are provided on the contact plugs 36, respectively. The metal pads 37 include, for example, a conductive material such as copper or tungsten. The CMOS circuit 50 having the configuration as described above is formed on the third face F41 of the substrate 40.

Figure 6:
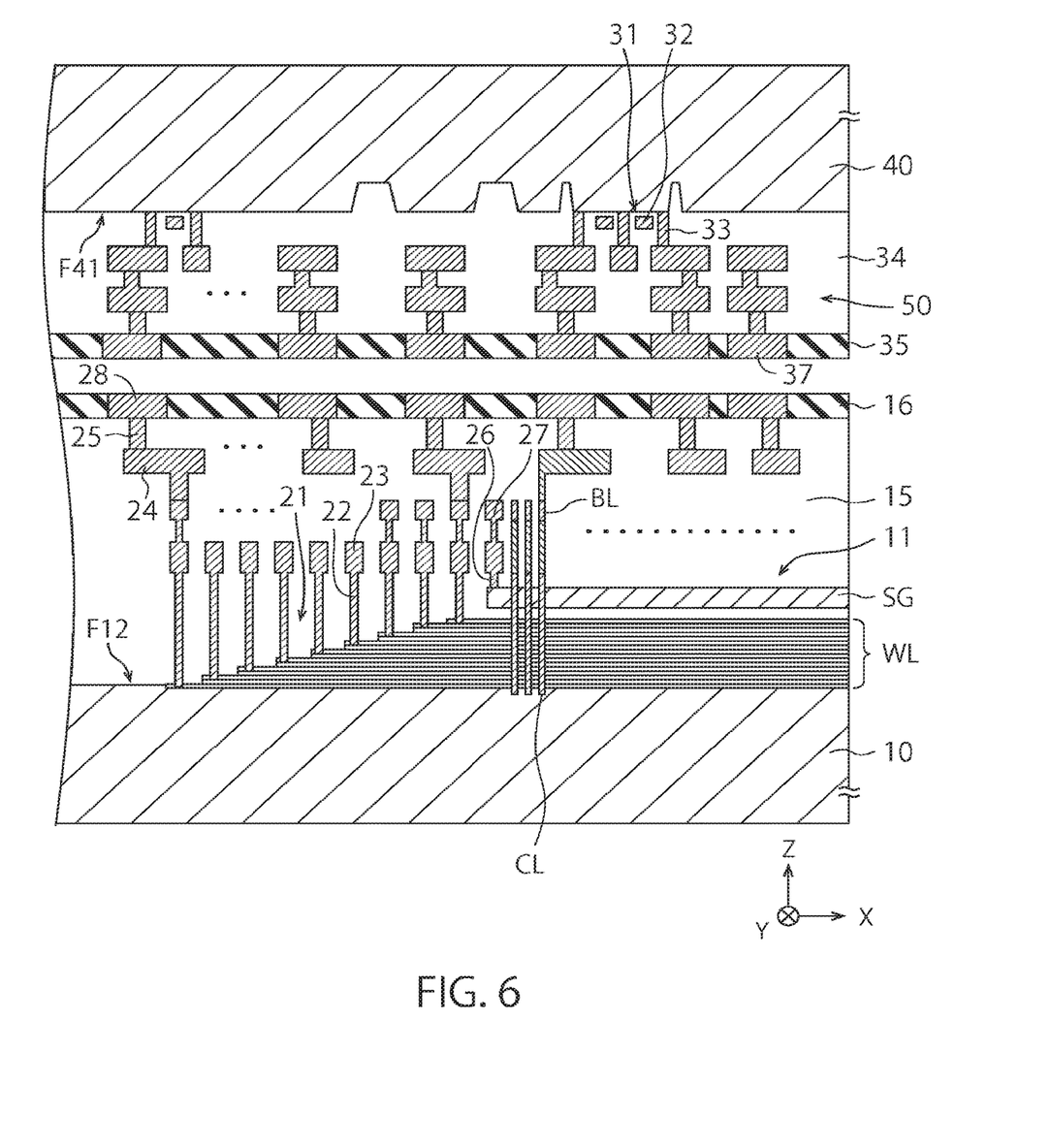
FIG. 6 is a sectional view illustrating a manner in which the substrate illustrated in FIG. 5 is joined to the substrate illustrated in FIG. 3.

When the substrate 40 having the CMOS circuit 50 is joined onto the substrate 10 having the memory cell array 11 as illustrated in FIG. 2B, the memory cell array 11 and the CMOS circuit 50 are stacked between the substrate 10 and the substrate 40 as illustrated in FIG. 6.

FIG. 6 is a sectional view illustrating a manner in which the substrate 40 illustrated in FIG. 5 is joined to the substrate 10 illustrated in FIG. 3. When the substrate 40 is inverted and is joined with the third face F41 toward the second face F12 of the substrate 10, the metal pads 28 provided on the substrate 10 and the metal pads 37 provided on the substrate 40 are electrically connected to each other. The CMOS circuit 50 is electrically connected to the memory cell array 11, which enables control of the memory cell array 11. In this way, the metal pads 28 and the metal pads 37 are positioned so as to correspond to each other when the CMOS circuit 50 and the memory cell array 11 are placed to face each other.

Figure 2C:
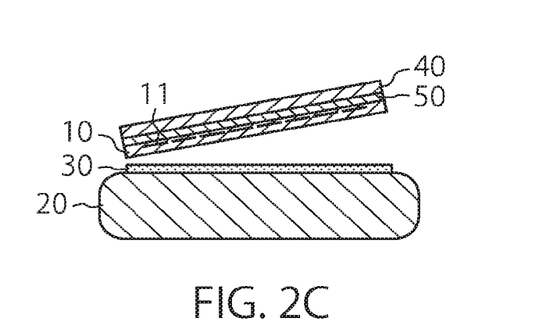

Referring back to FIG. 2, after the substrate 10 and the substrate 40 are joined, the substrate 10 is detached from the substrate 20 as illustrated in FIG. 2C. Because the separable layer 30 is a material more fragile than the substrates 10 and 20 as described above, the substrate 10 can be detached from the substrate 20 without damaging the substrates 10 and 20.

Figure 7:
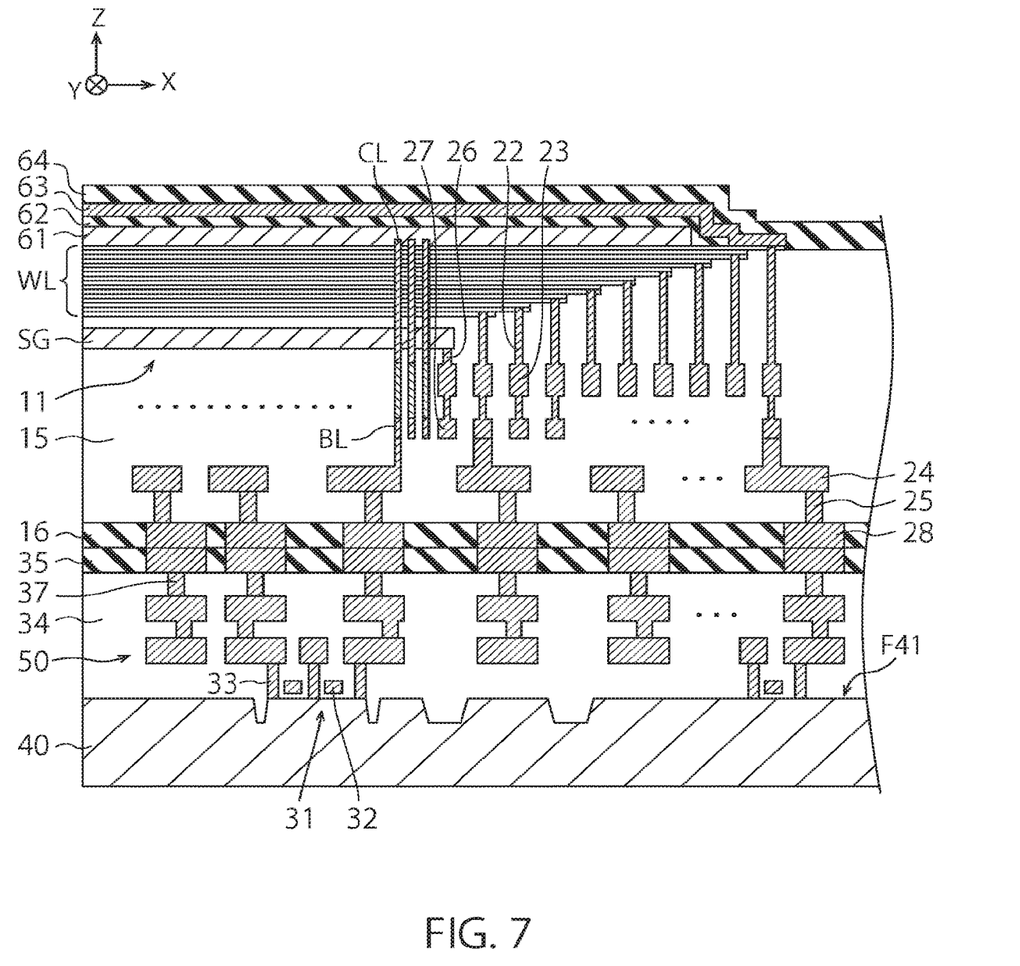
FIG. 7 is a sectional view illustrating a configuration of a semiconductor memory after formation of a back gate electrode.

Wires and the like may subsequently be formed by processing the substrate 10 or the substrate 40. For example, FIG. 7 is a sectional view illustrating a configuration of a semiconductor memory after formation of a back gate electrode. In FIG. 7, the substrate 10 is polished and a semiconductor layer 61, a back gate dielectric film 62, a back gate electrode 63, and a protection film 64 are formed on the memory cell array 11. The semiconductor layer 61 includes, for example, polysilicon or the like. The back gate dielectric film 62 includes, for example, a silicon dioxide film. The back gate electrode 63 includes, for example, a conductive metal. The protection film 64 includes, for example, an insulating film such ash polyimide. The semiconductor layer 61 is covered by the back gate dielectric film 62 and the back gate electrode 63. The semiconductor layer 61, the back gate dielectric film 62, and the back gate electrode 63 constitute a MOSFET (MOS Field Effect Transistor). The back gate electrode 63 forms channels in the semiconductor layer 61 in response to a voltage from the wiring layer 24 and electrically connects one ends of the columnar parts CL to a source line (not illustrated).

After the substrate 10 is detached as illustrated in FIG. 2C, the substrate 20 can be washed and reused. That is, after the used separable layer 30 is removed, a new separable layer 30 is formed on the substrate 20 and the processes illustrated in FIGS. 1A to 2C are repeated. Accordingly, the substrate 20 can be repeatedly used without being wasted. This leads to reduction of the manufacturing cost.

Through the above processes, a semiconductor memory according to the present embodiment is completed. The configuration of the embodiment described above is merely an example, and the present embodiment can be also applicable to other types of stacked semiconductor devices.

According to the present embodiment, the substrate 10 is joined onto the substrate 20 having a higher elastic modulus using the separable layer 30 so as to be detachable from the substrate 20. After the substrate 10 is thinned on the substrate 20, a semiconductor element is formed on the substrate 10. The substrate 20 is made of a material having a relatively high elastic modulus and being higher in the stiffness (being harder). Therefore, the substrate 20 does not warp so much and keeps a substantially flat state in the manufacturing process of a stack body such as a three-dimensional memory cell array. Accordingly, even when a stack body having a multilayer film is formed on the thinned substrate 10, the substrate 10 warps little and keeps the substantially flat state because the substrate 10 is joined to the substrate 20 and is supported thereby. For example, a three-dimensional memory cell array has a stack body in which the word lines WL and the insulating layers 51 are alternately stacked and applies stress to the substrate 10. However, because being supported by the substrate 20 having a higher elastic modulus, the substrate 10 warps little and keeps the substantially flat state along the surface of the substrate 20. As a result, a processing error, a transport error, breakage, and the like of the substrate 10 in the manufacturing process can be suppressed.

The substrate 10 may be detached from the substrate 20 in a state where no thermal load is applied thereto after the semiconductor memory is completed. Therefore, warp of the substrate 10 after completion of the semiconductor memory can also be suppressed.

Second Embodiment

Figure 8A:
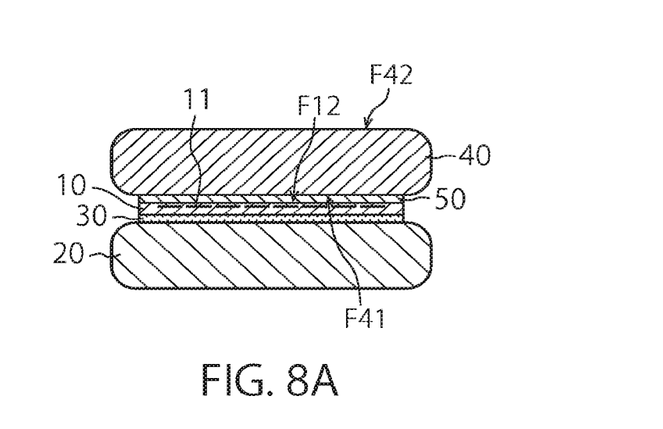
FIGS. 8A to 8C are sectional views illustrating a manufacturing method of a semiconductor memory according to a second embodiment.
Figure 8B:
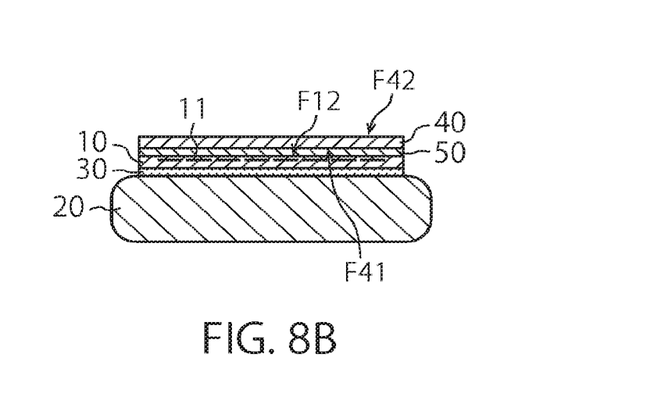
Figure 8C:
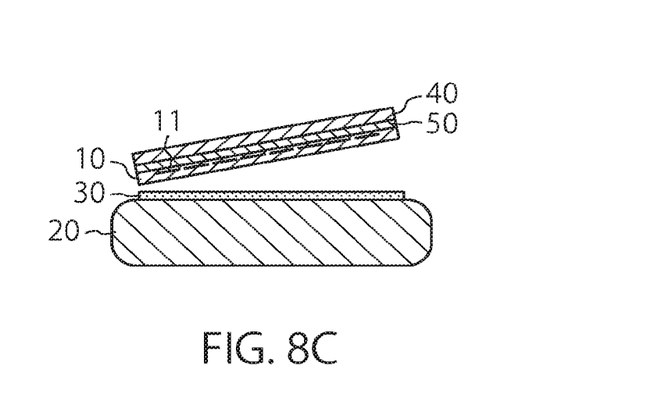

FIGS. 8A to 8C are sectional views illustrating a manufacturing method of a semiconductor memory according to a second embodiment. In the second embodiment, the substrate 40 as the third substrate is thinned after being joined to the substrate 10. FIGS. 8A to 8C illustrate a manufacturing method of the semiconductor memory following FIGS. 1A to 2A.

After the processes illustrated in FIGS. 1A to 2A are performed, the substrate 40 having the CMOS circuit 50 is joined (bonded) onto the second face F12 of the substrate 10 as illustrated in FIG. 8A. At this time, the substrate 40 is joined to the substrate 10 with the third face F41 (a face including the CMOS circuit 50) of the substrate 40 toward the second face F12 to enable the CMOS circuit 50 to connect to the memory cell array 11.

Next, as illustrated in FIG. 8B, a fourth face F42 of the substrate 40 on the opposite side to the third face F41 is polished by a polishing method (Back Side Grinding) or the CMP method. Accordingly, the substrate 40 is thinned. FIG. 8B and FIG. 2B have a substantially identical configuration.

Subsequently, the substrate 10 is detached from the substrate 20 as illustrated in FIG. 2C. Because the separable layer 30 is a material more fragile than the substrates 10 and 20 as described above, the substrate 10 can be detached from the substrate 20 without damaging the substrates 10 and 20. Thereafter, the substrate 10 or the substrate 40 is processed to form wires and the like. Accordingly, a semiconductor memory identical to that in the first embodiment is completed. The second embodiment can achieve effects identical to those of the first embodiment.

Third Embodiment

Figure 9A:
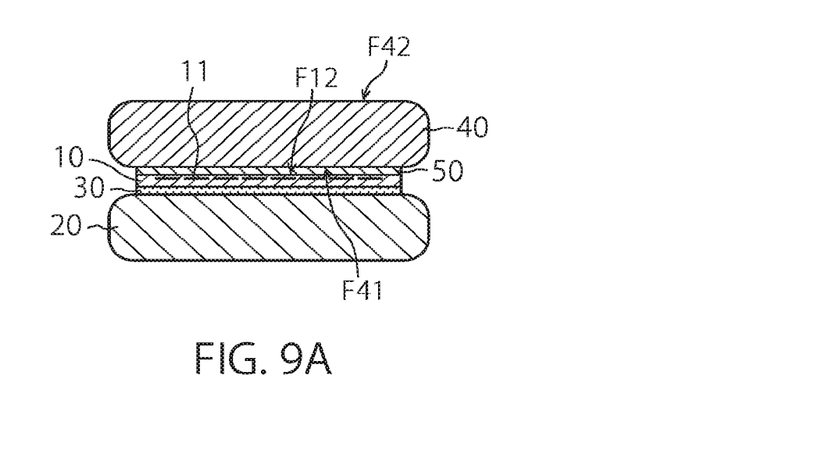
FIGS. 9A to 9C are sectional views illustrating a manufacturing method of a semiconductor memory according to a third embodiment.
Figure 9B:
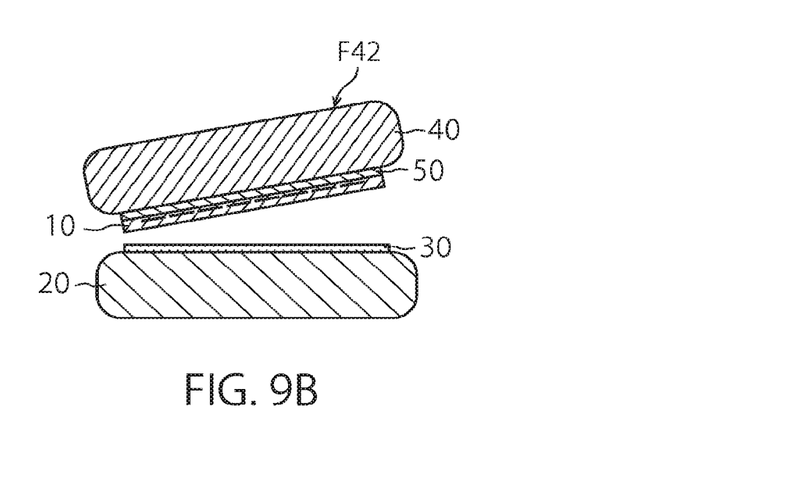
Figure 9C:
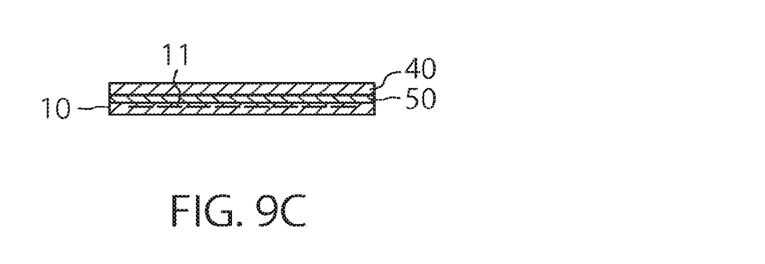

FIGS. 9A to 9C are sectional views illustrating a manufacturing method of a semiconductor memory according to a third embodiment. In the third embodiment, the substrate 40 as the third substrate is thinned after being detached from the substrate 10. FIGS. 9A to 9C illustrate a manufacturing method of a semiconductor memory following FIGS. 1A to 2A.

After the processes illustrated in FIGS. 1A to 2A are performed, the substrate 40 having the CMOS circuit 50 is joined (bonded) onto the second face F12 of the substrate 10 as illustrated in FIG. 9A. At this time, the substrate 40 is joined to the substrate 10 with the third face F41 (the face including the CMOS circuit 50) of the substrate 40 toward the second face F12 to enable the CMOS circuit 50 to connect to the memory cell array 11.

Next, the substrate 10 is detached from the substrate 20 as illustrated in FIG. 9B. Because the separable layer 30 is a material more fragile than the substrates 10 and 20 as described above, the substrate 10 can be detached from the substrate 20 without damaging the substrates 10 and 20.

Subsequently, the fourth face F42 of the substrate 40 on the opposite side to the third face F41 is polished by the CMP method as illustrated in FIG. 9C. At this time, the semiconductor element on the third face F41 is protected by a resin tape or the like. Accordingly, the substrate 40 is thinned. Thereafter, the substrate 10 or the substrate 40 is processed to form wires and the like, and a semiconductor memory identical to that in the first embodiment is completed.

In the third embodiment, the substrate 40 is thinned after detached from the substrate 20. However, a stack body such as a three-dimensional memory cell array is already completed and no thermal load is thereafter applied. Therefore, the substrates 10 and 40 do not warp so much and effects identical to those of the first embodiment can be also achieved in the third embodiment. The substrate 10 is detached from the substrate 20 before the substrate 40 is thinned. Therefore, when the substrate 10 is detached from the substrate 20, the substrate 40 that is relatively thick supports the substrate 10 and cracks and the like of the substrate 10 can be suppressed.

Fourth Embodiment

Figure 10A:
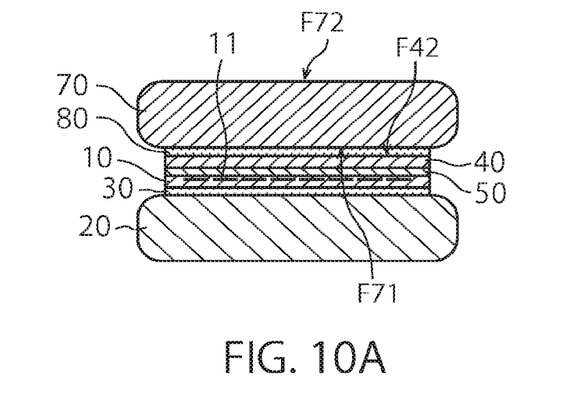
FIGS. 10A to 10C are sectional views illustrating a manufacturing method of a semiconductor memory according to a fourth embodiment.
Figure 10B:
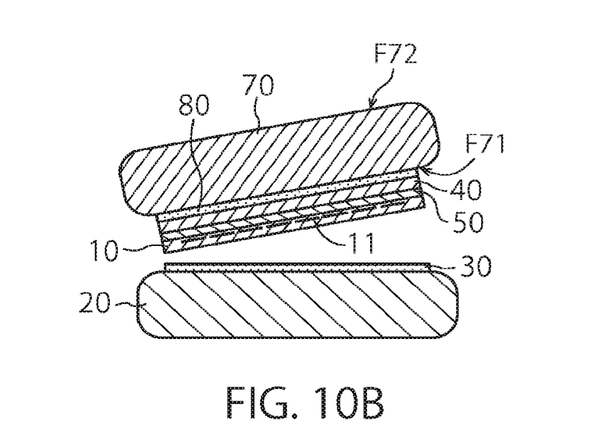
Figure 10C:
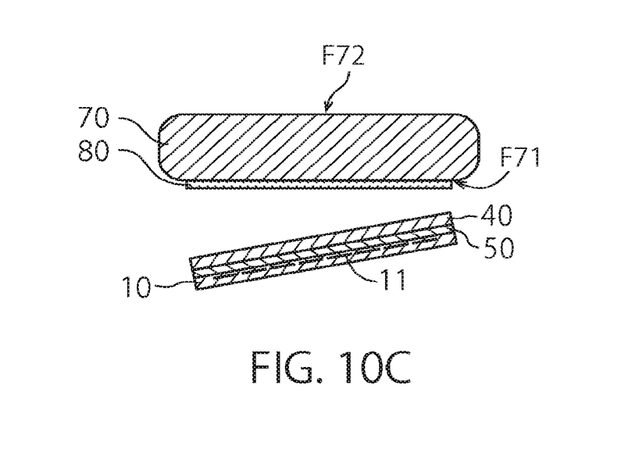

FIGS. 10A to 10C are sectional views illustrating a manufacturing method of a semiconductor memory according to a fourth embodiment. In the fourth embodiment, after the substrate 40 is polished, a substrate 70 as a fourth substrate is further joined to the substrate 40 and the substrates 10 and 40 are detached along with the substrate 70 from the substrate 20. FIGS. 10A to 10C illustrate a manufacturing method of a semiconductor memory following FIG. 8B.

After the processes illustrated in FIGS. 1A to 2A, 8A, and 8B are performed, the substrate 70 having a separable layer 80 formed thereon is joined (bonded) onto the fourth face F42 of the substrate 40 as illustrated in FIG. 10A. The substrate 70 can be made of a same material as that of the substrate 20. The separable layer 80 is provided on a fifth face F71 of the substrate 70. The substrate 70 is joined to the substrate 40 with the fifth face F71 toward the substrate 40. The separable layer 80 is preferably a material same as that of the separable layer 30 or harder than that of the separable layer 30. For example, when the separable layers 30 and 80 are both porous silicon, pores included in the separable layer 80 are preferably fewer than those included in the separable layer 30. This enables the substrate 10 to be detached from the substrate 20 in a process illustrated in FIG. 10B while the substrate 70 is kept joined to the substrate 40.

Next, the substrates 10, 40, and 70 are detached from the substrate 20 as illustrated in FIG. 10B. As described above, the separable layer 80 is a material more fragile (weaker) than the substrates 10, 20, 40, and 70 and harder than the separable layer 30. Therefore, the substrate 10 can be detached from the substrate 20 without damaging the substrates 10, 20, 40, and 70.

Subsequently, the substrate 70 is detached from the substrate 40 as illustrated in FIG. 10C. The separable layer 80 is a material more fragile than the substrates 10, 20, 40, and 70. Therefore, the substrate 70 can be detached from the substrate 20 without damaging the substrates 10, 40, and 70. Thereafter, the substrate 10 or the substrate 40 is processed to form wires and the like and a semiconductor memory identical to that in the first embodiment is completed. Also in the fourth embodiment, the substrates 10 and 40 do no warp so much and the fourth embodiment can achieve effects identical to those of the first embodiment.

The substrates 20 and 70 can be washed and reused. That is, after the used separable layers 30 and 80 are removed, new separable layers 30 and 80 are formed on the substrates 20 and 70, respectively, and the processes according to the fourth embodiment are repeated. Due to this process, the substrates 20 and 70 can be repeatedly used without being wasted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device, the method comprising:
    joining a first substrate having a first elastic modulus onto a second substrate having a second elastic modulus higher than the first elastic modulus;
    forming a first semiconductor element on the first substrate after the joining of the first substrate with the second substrate; and
    detaching the first substrate from the second substrate.

2. The method of claim 1, further comprising:
    after joining the first substrate to the second substrate, thinning the first substrate.

3. The method of claim 1, further comprising:
    before joining the first substrate to the second substrate, providing a first separable layer on the second substrate, the first separable layer joining the first substrate to the second substrate.

4. The method of claim 2, further comprising
    before joining the first substrate to the second substrate, providing a first separable layer on the second substrate, the first separable layer joining the first substrate to the second substrate.

5. The method of claim 1, wherein
    the first substrate is a silicon single crystal, and
    the second substrate is a single crystal or a polycrystal of SiC, AlN, SiN, or $Al_2O_3$, or a composite thereof.

6. The method of claim 2, wherein
    the first substrate is a silicon single crystal, and
    the second substrate is a single crystal or a polycrystal of SiC, AlN, SiN, or $Al_2O_3$, or a composite thereof.

7. The method of claim 3, wherein
    the first substrate is a silicon single crystal, and
    the second substrate is a single crystal or a polycrystal of SiC, AlN, SiN, or $Al_2O_3$, or a composite thereof.

8. The method of claim 3, wherein the first separable layer is silicon or a silicon dioxide film having a porous structure.

9. The method of claim 1, wherein the first semiconductor element comprises a CMOS (Complementary Metal-Oxide-Semiconductor), and a memory cell array formed on the CMOS.

10. The method of claim 1, further comprising:
    forming a second semiconductor element on a third substrate;
    joining the third substrate to the first substrate to connect the second semiconductor element to the first semiconductor element; and
    detaching the first and third substrates from the second substrate.

11. The method of claim 2, further comprising:
forming a second semiconductor element on a third substrate;
joining the third substrate to the first substrate to connect the second semiconductor element to the first semiconductor element; and
detaching the first and third substrates from the second substrate.

12. The method of claim 3, further comprising:
forming a second semiconductor element on a third substrate;
joining the third substrate to the first substrate to connect the second semiconductor element to the first semiconductor element; and
detaching the first and third substrates from the second substrate.

13. The method of claim 10, further comprising:
before the third substrate is detached from the second substrate after being joined to the first substrate,
polishing the third substrate.

14. The method of claim 10, further comprising:
after the third substrate is detached from the second substrate,
polishing the third substrate.

15. The method of claim 10, further comprising:
after joining the third substrate to the first substrate,
thinning the third substrate;
joining a fourth substrate to the third substrate;
detaching the first, third, and fourth substrates from the second substrate; and
further detaching the first and third substrates from the fourth substrate.

16. The method of claim 10, further comprising:
after joining the third substrate to the first substrate,
thinning the third substrate;
joining a fourth substrate to the third substrate;
detaching the first, third, and fourth substrates from the second substrate; and
further detaching the first and third substrates from the fourth substrate.

17. The method of claim 10, wherein
the first semiconductor element is a memory cell array, and
the second semiconductor element is a CMOS.

18. The method of claim 15, wherein a second separable layer joining the fourth substrate and the third substrate to each other is porous silicon or a silicon dioxide film.

19. The method of claim 18, wherein the second separable layer is porous silicon having fewer pores than a first separable layer that is provided on the second substrate.

* * * * *